(12) United States Patent
Russell et al.

(10) Patent No.: US 9,358,750 B2
(45) Date of Patent: Jun. 7, 2016

(54) NANOPATTERNED ARTICLES PRODUCED USING SURFACE-RECONSTRUCTED BLOCK COPOLYMER FILMS

(71) Applicant: THE UNIVERSITY OF MASSACHUSETTS, Boston, MA (US)

(72) Inventors: Thomas P. Russell, Amherst, MA (US); Soojin Park, Amherst, MA (US); Jia-Yu Wang, Chicago, IL (US); Bokyung Kim, Amherst, MA (US)

(73) Assignee: THE UNIVERSITY OF MASSACHUSETTS, Boston, MA (US)

( * ) Notice: Subject to any disclaimer, the term of this patent is extended or adjusted under 35 U.S.C. 154(b) by 57 days.

(21) Appl. No.: 13/944,329

(22) Filed: Jul. 17, 2013

(65) Prior Publication Data
US 2013/0302632 A1 Nov. 14, 2013

Related U.S. Application Data

(62) Division of application No. 12/566,705, filed on Sep. 25, 2009, now Pat. No. 8,518,837.

(60) Provisional application No. 61/100,004, filed on Sep. 25, 2008.

(51) Int. Cl.
*H01L 51/00* (2006.01)
*B32B 3/10* (2006.01)
(Continued)

(52) U.S. Cl.
CPC ............... *B32B 3/10* (2013.01); *B81C 1/00031* (2013.01); *B82Y 30/00* (2013.01); *B81C 2201/0149* (2013.01); *Y10T 428/12049* (2015.01); *Y10T 428/24355* (2015.01)

(58) Field of Classification Search
CPC .................. B32B 3/10; B81C 1/00031; B81C 2201/0149; B82Y 30/00; Y10T 428/12049; Y10T 428/24355; H01L 21/02118; H01L 21/02203

USPC ............. 437/781; 257/40.622, 798, E51.027, 257/E51.036
See application file for complete search history.

(56) References Cited

U.S. PATENT DOCUMENTS 5,079,268 A    1/1992   Nelissen et al.
5,314,569 A *  5/1994   Pribat et al. ..................... 117/75
(Continued)

FOREIGN PATENT DOCUMENTS

GB          1294406       10/1972
WO      2007038381 A2    4/2007

OTHER PUBLICATIONS

Campo et al., Fabrication Approaches for Generating Complex Micro- and Nanopatterns on Polymeric Surfaces, Chem. Rev. 2008, 108, 911-945.
(Continued)

*Primary Examiner* — Duy T Nguyen
(74) *Attorney, Agent, or Firm* — Cantor Colburn LLP

(57) ABSTRACT

Nanopatterned surfaces are prepared by a method that includes forming a block copolymer film on a substrate, annealing and surface reconstructing the block copolymer film to create an array of cylindrical voids, depositing a metal on the surface-reconstructed block copolymer film, and heating the metal-coated block copolymer film to redistribute at least some of the metal into the cylindrical voids. When very thin metal layers and low heating temperatures are used, metal nanodots can be formed. When thicker metal layers and higher heating temperatures are used, the resulting metal structure includes nanoring-shaped voids. The nanopatterned surfaces can be transferred to the underlying substrates via etching, or used to prepare nanodot- or nanoring-decorated substrate surfaces.

2 Claims, 6 Drawing Sheets

(51) Int. Cl.
B81C 1/00 (2006.01)
B82Y 30/00 (2011.01)

(56) References Cited

U.S. PATENT DOCUMENTS

| | | | |
|---|---|---|---|
| 5,772,905 A | 6/1998 | Chou | |
| 6,635,904 B2 | 10/2003 | Goetz et al. | |
| 6,746,825 B2 | 6/2004 | Nealey et al. | |
| 6,858,521 B2 | 2/2005 | Jin | |
| 6,893,705 B2 | 5/2005 | Thomas et al. | |
| 6,926,953 B2 | 8/2005 | Nealey et al. | |
| 6,943,117 B2 | 9/2005 | Jeong et al. | |
| 7,030,167 B2 | 4/2006 | Gunther | |
| 7,081,269 B2 | 7/2006 | Yang et al. | |
| 7,138,325 B2 | 11/2006 | Maleville et al. | |
| 7,189,435 B2 | 3/2007 | Tuominen et al. | |
| 7,190,049 B2 | 3/2007 | Tuominen et al. | |
| 7,632,544 B2 * | 12/2009 | Ho | C08J 5/005 427/256 |
| 2004/0124092 A1 | 7/2004 | Black et al. | |
| 2004/0175628 A1 | 9/2004 | Nealey et al. | |
| 2004/0265548 A1 | 12/2004 | Ho et al. | |
| 2005/0014855 A1 | 1/2005 | Bruza et al. | |
| 2005/0235906 A1 | 10/2005 | Legagneux et al. | |
| 2006/0093939 A1 | 5/2006 | Moudry et al. | |
| 2006/0093954 A1 | 5/2006 | Moudry et al. | |
| 2006/0205875 A1 | 9/2006 | Cha et al. | |
| 2006/0231525 A1 * | 10/2006 | Asakawa et al. | 216/56 |
| 2006/0257565 A1 | 11/2006 | Jin et al. | |
| 2006/0292870 A1 | 12/2006 | Pribat | |
| 2007/0153222 A1 | 7/2007 | Jo et al. | |
| 2008/0014528 A1 * | 1/2008 | Bailey et al. | 430/200 |
| 2008/0157314 A1 | 7/2008 | Clevenger et al. | |
| 2008/0230514 A1 | 9/2008 | Park et al. | |
| 2008/0311402 A1 | 12/2008 | Jung et al. | |
| 2008/0315270 A1 | 12/2008 | Marsh et al. | |
| 2009/0087664 A1 * | 4/2009 | Nealey | B81C 1/00031 428/411.1 |
| 2010/0075116 A1 | 3/2010 | Russell et al. | |
| 2010/0112308 A1 | 5/2010 | Russell et al. | |
| 2011/0059299 A1 | 3/2011 | Kim et al. | |

OTHER PUBLICATIONS

L. Rockford, Y. Liu, T.P. Russell, M. Yoon, and S.C.J. Mochrie, Physical Review Letters, 1999, vol. 82, p. 2602-2605.
Rockford et al., Propagation of nanopatterned substrate templated ordering of block copolymer in thick films, Macromolecules 34, 1487 (2001).
Ross, Annual Review of Materials Research, 2001, vol. 31, p. 203 ff.
T.P. Russell, P. Lambooy, J.G. Barker, P.D. Gallagher, S.K. Satija, G.J. Kellogg, and A.M. Mayes, Macromolecules 1995, 28, 787.
S.A. Maier, M.L. Brongersma, P.G. Kik, S. Meltzer, A.A.G. Requicha, and H.A. Atwater, Advanced Materials, 2001, vol. 13, p. 1501 ff.
R.A. Segalman, Materials Science and Engineering, 2005, vol. R48, p. 191 ff.
R.A. Segalman, H. Yokoyama and E.J. Kramer, Advanced Materials, 2001, vol. 13, p. 1152 ff.
B.H. Sohn, J.M. Choi, S.I. Yoo, S.H. Yun, W.C. Zin, J.C. Jung, M. Kanehara, T. Hirata, T. Teranishi, J. Am. Soc. Chem. 2003, 125, 6368.
B.H. Sohn, B.W. Seo, S.I. Yoo, W.C. Zin, Langmuir 2002, 18, 10505.
S. Song, S.G.J. Mochrie, and G.B. Stephenson, Physical Review Letters, 1995, vol. 74, p. 5240-5243.
S. Song, and S.G.J. Mochrie, Physical Review B, 1995, vol. 51, p. 10068 ff.
M.P. Stoykovich et al., Science 2005, vol. 308, p. 1442 ff.
C. Tang, A. Tracz, M. Kruk, R. Zhang, D.-M. Smilgies, K. Matyjaszewski, and T. Kowalewski, Journal of the American Chemical Society, 2005, vol. 127, p. 6918 ff.
R.B. Thompson, V.V. Ginburg, M.W. Matsen, A.C. Balazs, Science 2001, 292, 2469.
T. Thurn-Albrecht, J. DeRouchey, and T.P. Russell, Macromolecules, 2000, vol. 33, pp. 3250-3253.
T. Thurn-Albrecht, J. Schotter, G.A. Kastle, N. Emley, T. Shibauchi, L. Krusin-Elbaum, K. Guarini, C.T. Black, M.T. Tuominen, T. Russell, P. Science 2000, 290, 2126.
M.A. Villar, D.R. Rueda, F. Ania, and E.L. Thomas, Polymer, 2002, vol. 43, p. 5139 ff.
D. Wyrwa, N. Beyer, and G. Schmid, G. Nano Letters, 2002, vol. 2, p. 419.
T. Xu, C.J. Hawker, and T.P. Russell, Advanced Functional Materials 2003, 13, 698.
Asakawa et al, "Nano-Patterning for Patterned Media Using Block-Copolymer", Journal of Photopolymer Science and Technology, vol. 15, No. 2, 2002, p. 465-470.
Bal et al, "Nanofabrication of integrated magnetoelectronic devices using patterned self-assembled copolymer templates", Applied Physics Letters vol. 81, No. 18, 2002, p. 3479-3481.
Black et al, "Integration of self-assembled diblock copolymers for semiconductor capacitor fabrication", Applied Physics Letters, vol. 79, No. 3, 2001, p. 409-411.
Chan et al, "Ordered Bicontinuous Nanoporous and Nanorelief Ceramic Films from Self Assembling Polymer Precursers", Science 286, 1999, p. 1716-1719.
Cheng et al, "Formation of a Cobalt Magnetic Dot Array via Block Copolymer Lithography", Advanced Materials 13, 2001, 5 pages.
De Rosa et al, "Microdomain patters from directional eutectic solidification and epitaxy", Nature 405, 2000, 5 pages.
Du et al, "Additive-Driven Phase-Selective Chemistry in Block Copolymer Thin Films: The Convergence of Top-Down and Bottom-Up Approaches", Advanced Materials, vol. 16, No. 12, 2004, p. 953-957.
Elhadji et al, "Orientation of self-assembled block copolymer cylinders perpendicular to electric field in mesoscale film", Applied Physics Letters, vol. 82, No. 6, 2003, p. 871-873.
Fasolka et al, "Block Copolymer Thin Films: Physics and Applications", Ann. Rev. Mater. Res. 31, 2004, 18 pages.
Fukunaga et al, "Large-Scale Alignment of ABC Block Copolymer Microdomains via Solvent Vapor Treatment", Macromolecules 33, 2000, p. 947-953.
Fukutani et al, "Ultrahigh Pore Density Nanoporous Films Produced by the Phase Separation of Eutectic Al-Si for Template-Assisted Growth of Nanowire Arrays", Advanced Materials, vol. 16, No. 16, 2004, p. 1456-1460.
Gaubert et al, "Highly parallel fabrication of nanopatterned surfaces with nanoscale orthogonal biofunctionalization imprint lithography", Nanotechnology, 18, 2007, p. 1-7.
Guarini et al, "Nanoscale patterning using self-assembled polymers for semiconductor applications", J. Vac. Sci. Tech. B 19, 2001, 5 pages.
Harrison et al, "Lithography with a mas of block copolymer microstructures", J. Vac. Sci. Technol. B 16(2), 1998, p. 544-552.
Hartney et al, "Block copolymers as bilevel resists", J. Vac. Sci. Tech. B 3, 1985, p. 1346-1351.
Haupt et al, "Nanoporous Gold Films Created using Templates Formed from Self-Assembled Structures of Inorganic-Block Copolymer Micelles", Advance Materials 15, 2003, 3 pages.
Heier et al, "Thin Diblock Copolymer Films on Chemically Heterogeneous Surfaces", Macromolecules 30, 1997, p. 6610-6614.
Huang et al, "Modeling copolymer Adsorption on laterally Hetergeneous Surfaces", Physical Review Letters, vol. 66, No. 5, 1991, p. 620-623.
International Search Report and Written Opinion for PCT/2008057187, mailing date Apr. 8, 2008, 16 pages.
International Search Report for PCT/US2008057187, mailing date Apr. 8, 2008, 7 pages.
JP2001189466, EPO Abstract, Jul. 10, 2001, 2 pages.
Kim et al, "Epitaxial self-assembly of block copolymers on lithographically defined nanopatterned substrates", Nature 424, 2003, p. 411-414.
Lammertink et al, "Nanostructured Thin Films of Organic-Organometallic Block Copolymers: One-Step Lithography with Poly(ferrocenylsilanes) by Reactive Ion Etching", Advance Materials, 12, 2000, 6 pages.

(56) References Cited

OTHER PUBLICATIONS

Lammertink et al, "Poly(ferrocenyldimethylsilanes) for Reactive Ion Etch Barrier Applications", Chem. Mater. 13, 2001, p. 429-434.
Li et al. Dense arrays of ordered GaAS nanostructures by selective area growth on substrates patterned by block copolymer lithography, Appl. Phys. Lett, 76, 2000, p. 1689-1691.
Li et al. Spatially controlled fabrication of nanoporous block copolymers. Chem. Mater. 16, 3800, 2004, 1 page, Abstract.
Mansky et al, "Large-Area Domain Alignment in Block Copolymer Thin Films Using Electric Fields", Macromolecules 31, 1998, p. 4399-4401.
Morkved et al, "Local Control of Microdomain Orientations in Diblock Copolymer Thin Filmes with Electric Fields", Science, vol. 273, 1996, p. 931-933.
Park et al, "A simple route to highly oriented and ordered nanoporous block copolymer templates", ACS Nano, vol. 2, No. 4, 2008, p. 766-772.
Park et al, "Large area orientation of block copolymer microdomains in thin films via directional crystallization of a solvent", Macromolecules, 34, 2001, p. 2602-2606.
Park et al. "Block Copolymer Lithography", Science, vol. 276, 1997, 1401-1404.
Pereira et al, "Diblock Copolymer Thin Film Melts on Striped, Heterogeneous Surfaces: Parallel, Perpendicular and Mixed Lamellar Morphologies", Macromolecules 32, 1999, p. 758-764.
Russell et al, "Block Copolymers As Nanoscopic Templates", Macromol. Symp. 159, 2000, p. 77-88.
Spatz et al, "Micellar Inorganic—Polymer Hybrid Systems—A Tool for Nanolithography", Advanced Materials 11, No. 2, 1999, p. 149-153.
Spatz et al, "Ultrathin Diblock Copolymer/Titanium Laminates—A Tool for Nanolithography", Advanced Materials 10, 1998, p. 849-852.
Spatz et al, "A Combined Top-Down/Bottom-Up Approach to the Microscopic Localization of Metallic Nanodots", Advanced Materials, vol. 14, No. 24, 2002, p. 1827-1832.
Stoykovich et al, "Block copolymers and conventional lithography", Materials Today, vol. 9, No. 9, 2006, p. 20-29.
Temple et al, "Spontaneous Vertical Ordering and Pyrolytic Formation of Nanoscopic Cermaic Patterns from Poly (styrene-b-ferrocenysilane)", Advanced Materials 15, 2003, 13 pages.
Thurn-Albrecht et al, "Nanoscopic Templates from Oriented Block Copolymer Films", Advance Materials 12, 2000, 4 pages.
U.S. Appl. No. 12/049,541 Non-Final Office Action, Mar. 1, 2011, 52 pages.
Wang et al, "One step fabrication and characterization of platinum nanopore electrode ensembles formed via amphiphilic block copolymer self-assembly", Science Direct 52, 2006, p. 704-709.
Wang et al, "Simulations of the Morphology of Cylinder-Forming Asymmetric Diblock Copolymer Thin Films on Nanopatterned Substrates", Macromolecules 36, 2000, p. 1731-1740.
Williams et al, "Etch Rates for Micromachining Processing—Part II", J. Micro. Sys. vol. 12, No. 6, 2003, p. 761-778.
Xu et al, "Interfacial Energy Effects on the Electric Field Alignment of Symmetric Diblock Copolymers", Macromolecules 36, 2003, p. 6178-6182.
Xu et al, "The influence of molecular weight on nanoporous polymer films", Polymer 42, 2001, p. 9091-9095.
Yang et al, "Guided Self-Assembly of Symmetric Diblock Copolymer Films on Chemically Nanopatterned Substrates", Macromolecules 33, 2000, p. 9575-9582.
Zalusky et al, "Mesoporous Polystyrene Monoliths", J. Am. Chem. Soc. 123, 2001, p. 1519-1520.
U.S. Appl. No. 12/049,541 Final Office Action, notification date Jul. 6, 2011, 12 pages.
U.S. Appl. No. 13/461,175, filed May 1, 2012.
U.S. Appl. No. 13/480,506, filed May 25, 2012.
U.S. Appl. No. 13/546,378, filed Jul. 6, 2012.

Kim et al., "Phase transition behavior in think films of block copolymers by use of immiscible solvent vapors", Soft Matter 7, 2001, pp. 443-447.
Park et al., "Enabling nanotechnology with self assembled block copolymer patterns", Polymer 44, 2003, pp. 6725-6760.
I. A. Ansari, I.W. Hamley, J. Mater. Chem. 2003, 13, 2412.
C.T. Black, IEEE Transactions on Nanotechnology, 2004, vol. 3, p. 412 ff.
C.T. Black, C.B. Murray, R.L. Sandstrom, S. Sun, Science 2000, 290, 1131.
M.R. Bockstaller, R.A. Mickiewicz, E.L. Thomas, Adv. Mater. 2005, 17, 1331.
J.Y. Cheng, C.A. Ross, E.L. Thomas, H.I. Smith, G. J. Vancso, Appl. Phys. Lett. 2002, 81, 3657.
G. Cheng, M. Moskovits, Adv. Mater. 2002, 14,1567.
J.J. Chiu, B.J. Kim, E.J. Kramer, D.J. Pine, E.J. Kramer, Adv. Mater. 2005, 127, 5036-5037.
S.Y. Chou, P.R. Krauss, W. Zhang, L. Guo, and L. Zhuang, Journal of Vacuum Science and Technology B, 1997, vol. 15, p. 2897 ff.
E. Drockenmuller, L.Y.T. Li, D.Y. Ryu, E. Harth, T.P. Russell, H.C. Kim and C.J. Hawker, Journal of Polymer Science, Part A: Polymer Chemistry, 2005, vol. 43, p. 1028 ff.
H.J. Fan, P. Werner, M. Zacharias, Small 2006, 2, 700.
Fasolka et al., Observed Substrate Topography-Mediated Lateral Patterning of Diblock Copolymer Films, Phys. Rev. Lett., 79, 3018 (1997).
D.L. Feldheim, K.C. Grabar, M.J. Natan, T.E. Mallouk, J. Am. Chem. Soc. 1996, 118, 7640.
J.M. Gibson, Physics Today, 1997, vol. 50, p. 56 ff.
R. Glass, M. Arnold, E.A. Cavalcanti-Adam, J. Blummer, C. Haferkemper, C. Dodd, and J.P. Spatz, New Journal of Physics, 2004, vol. 6, p. 101 ff.
A. Golzhauser, W. Eck, W. Geyer, V. Stadler, T. Weimann, P. Hinze, and M. Grunze, Advanced Materials, 2001, vol. 13, p. 806 ff.
B. Gorzolnik, P. Mela, M. Moeller, Nanotechnology 2006, 17, 5027.
K.W. Guarini, C.T. Black, Y. Zhang, H. Kim, E.M. Sikorski, I. Babich, V.J. Vac. Sci. Technol. B 2002, 20, 2788.
J. Hahm and S.J. Sibener, Langmuir, 2000, vol. 16, p. 4766 ff.
I.W. Hamley, Agnew. Chem. Int. Ed. 2003, 42, 1692.
A. Haryono, W.H. Binder, Small 2006, 2, 600.
Hawker and Russell, MRS Bulletin, 2005, vol. 30, p. 952 ff.
Heier et al., J. Chem. Phys. 1999, 111, 11101-11110.
R.M. Ho, W.H. Tseng, H.W. Fan, Y.W. Chiang, C.C. Lin, B.T. Ko, and B.H. Huang, Polymer, 2005, vol. 46, p. 9362 ff.
K. Honda, T.N. Rao, D.A. Tryk, A. Fujishima, M. Watanabe, K. Yasui, H. Masuda, J. Electrochem. Soc. 2001, 148, A668.
E. Huang et al., Nature 1998, 395, 757-758.
J. Bodycomb, Y. Funaki, K. Kimishima and T. Hashimoto, Macromolecules, 1999, vol. 32, p. 2075 ff.
T.F. Jaramillo, S.H. Baeck, B.R. Cuenya, E.W. McFarland, J. Am. Chem. Soc. 2003, 125, 7148.
G. Kim and M. Libera, Macromolecules, 1998, vol. 31, p. 2569 ff.
B.J. Kim, J.J. Chiu, G. Yi, D.J. Pine, J. Am. Soc. Chem. 2005, 17, 2618-2622.
S.H. Kim, M.J. Misner, T. Xu, M. Kimura, and T.P. Russell, Advanced Materials 2004, vol. 16, p. 226 ff.
S.H. Kim, M. J. Misner, L. Yang, O. Gang, B.M. Ocko, T.P. Russell, Macromolecules 2006, vol. 39, p. 8473 ff.
M. Kimura, M.J. Misner, T. Xu, S.H. Kim, and T.P. Russell, Langmuir, 2003, vol. 19, p. 9910 ff.
T. Kubo, J.S. Parker, M.A. Hillmyer, C. Leighton, Appl. Phys. Lett. 2007, 90, 233113.
H.W. Li and W.T.S. Huck, Nano Letters, 2004, vol. 4, p. 1633-1636.
M. Li and C.K. Ober, Materials Today, 2006, vol. 9, p. 30 ff.
M. Li, C.A. Coenjarts and C.K. Ober, Advances in Polymer Science, 2005, vol. 190, p. 183 ff.
Z. Lin, D.H. Kim, X. Wu, L. Boosanda, D. Stone, L. LaRose, and T.P. Russell, Advanced Materials, 2002, vol. 14, p. 1373 ff.
Y. Lin, A. Boker, J. He, K. Sill, H. Xiang, C. Abetz, X. Li, J. Wang, T. Emrick, S. Long, Q. Wang, A. Balazs, T.P. Russell, Nature 2005, 434, 55.
W.A. Lopes, H.M. Jaeger, Nature 2001, 414, 735.

(56) References Cited

OTHER PUBLICATIONS

S. Ludwigs, A. Boker, A. Voronov, N. Rehse, R. Magerle, and G. Krausch, G. Nature Materials, 2003, vol. 2, p. 744 ff.
A.M. Mayes, S.K. Kumar, MRS Bulletin, 1997, 22, 43.
M.V. Meli, A. Badia, P. Grutter, R.B. Lennox, Nano. Lett. 2002, 2, 131.
Y. Morikawa, S. Nagano, K. Watanabe, K. Kamata, T. Lyoda and T. Seki, Advanced Materials, 2006, vol. 18, p. 883 ff.
P. Mansky, Y. Liu, E. Huang, T.P. Russell, and C.J. Hawker, Science 1997, vol. 275, p. 1458-1460.
S. Park, B. Kim, J.Y. Wang, and T.P. Russell, Advanced Materials, 2008, vol. 20, p. 681.
M. Park, P.M. Chaikin, R.A. Register, D.H. Adamson, Appl. Phys. Lett. 2001, 79, 257.
S. Park, J.Y. Wang, B. Kim, W. Chen, and T.P. Russell, Macromolecules 2007, vol. 40, p. 9059 ff.
S. Park, J.Y. Wang, B. Kim, and T.P. Russell, From Nanorings to Nanodots by Patterning with Block Copolymers, Nano Letters 2008, 8, 1667.
Park et al., Macroscopic 10-Terabit-per-Square-Inch Arrays from Block Copolymers with Lateral Order, Science, vol. 323, pp. 1030-1033 (print edition Feb. 20, 2009).
V. Pelletier, K. Asakawa, M. Wu, D.H. Adamson, R.A. Register, and P.M. Chaiken, Applied Physics Letters, 2006, vol. 88, pp. 211114 ff.
Final Office Action dated Dec. 31, 2014; U.S. Appl. No. 14/048,073, filed Oct. 8, 2013; (6 pages).
Kim et al, "Nanoparticle-Induced Phase Transitions in Diblock-Copolymer Films", Advanced Materials, vol. 17, No. 21, 2005. Abstract.
Non-Final Office Action dated Jan. 23, 2015; U.S. Appl. No. 13/546,378, filed Jul. 11, 2012 (22 pages).
Non-Final Office Action dated Oct. 31, 2014; U.S. Appl. No. 14/048,073, filed Oct. 8, 2013; (29 pages).
Non-Final Office Action for U.S. Appl. No. 12/049,541, filed Mar. 17, 2008, Notification Date Mar. 1, 2011, (52 pages).
Segalman et al., "Ordering and Melting of Block Copolymer Spherical Domains in 2 and 3 Dimensions", Macromolecules, 2003, 36(9), 3272-3288.
Kim, Ho-Cheol, et al., "A Route to Nanoscopic SiO2 Posts via Block Copolymer Templates", Advanced Materials, 2001, 13, No. 11 Jun. 5; pp. 795-797.
Park et al., "Double textured cylindrical block copolymer domains via directional solidification on a topographyically patterned substrate", Applied Physics Letters, vol. 79, No. 6, 2001, pp. 848-850.
Chuang, V. et al., "Three-Dimensional Self-Assembly of Spherical Block Copolymer Domains into V-Shaped Grooves", Nano Letters, 2006, vol. 6, No. 10; pp. 2332-2337.
Gates, et al. "New Approaches to Nanofabrication: Molding, Printing, and Other Techniques" Chem Rev. 2005, 105, 1171-1196.
Zhu, L. et al., "Nanotalored Crystalline Morphology in Hexagonally Perforated Layers of a Self Assembled PS-b-PEO Diblock Copolymer", Macromolecules, 2002, vol. 35, No. 9; pp. 3553-3562.
Jung, Y. et al., Orientation-Controlled Self-Assembled Nanolithography Using a Polystyrene-Polydimethylsiloxane Block Copolymer, 2007, vol. 7, pp. 2046-2050.
Non-Final Office Action dated Apr. 26, 2013 for U.S. Appl. No. 13/546,378, filed Jul. 11, 2012; 42 pages.
Non-Final Office Action dated Sep. 16, 2015 for U.S. Appl. No. 13/546,378, filed Jul. 11, 2012; 32 pages.

\* cited by examiner

NANOPATTERNED ARTICLES PRODUCED USING SURFACE-RECONSTRUCTED BLOCK COPOLYMER FILMS

CROSS REFERENCE TO RELATED APPLICATIONS

This application is a division of U.S. patent application Ser. No. 12/566,705 filed Sep. 25, 2009, issued on Aug. 27, 2013 as U.S. Pat. No. 8,518,837, which claims the benefit of U.S. Provisional Patent Application Ser. No. 61/100,004 filed Sep. 25, 2008. The priority applications are fully incorporated herein by reference.

STATEMENT REGARDING FEDERALLY SPONSORED RESEARCH & DEVELOPMENT

The U.S. Government has certain rights in this invention pursuant to National Science Foundation MRSEC on Polymers Grant No. DMR-0213695, and Department of Energy, Office of Basic Energy Sciences Grant No. DE-FG02-96ER45612.

BACKGROUND OF THE INVENTION

Microphase separated block copolymers (BCPs) offer unique opportunities to control the spatial distribution of nanoparticles, opening pathways to improve the mechanical strength, conductivity, permeability, catalytic activity, and optical and magnetic properties of thin films See, for example, Jaramillo, T. F.; Baeck, S. H.; Cuenya, B. R.; McFarland, E. W. *J. Am. Chem. Soc.* 2003, 125, 7148; Feldheim, D. L.; Grabar, K. C.; Natan, M. J.; Mallouk, T. E. *J. Am. Chem. Soc.* 1996, 118, 7640; Honda, K.; Rao, T. N.; Tryk, D. A.; Fujishima, A.; Watanabe, M.; Yasui, K.; Masuda, H. *J. Electrochem. Soc.* 2001, 148, A668; Bockstaller, M. R.; Mickiewicz, R. A.; Thomas, E. L. *Adv. Mater.* 2005, 17, 1331; and Fan, H. J.; Werner, P.; Zacharias, M. *Small* 2006, 2, 700. The ability to control the orientation and lateral ordering of BCP morphologies makes BCPs particularly attractive as scaffolds and templates for the fabrication of nanostructured materials. See, for example, Haryono, A.; Binder, W. H. *Small* 2006, 2, 600; Black, C. T.; Murray, C. B.; Sandstrom, R. L.; Sun, S. *Science* 2000, 290, 1131; Thurn-Albrecht, T.; Schotter, J.; Kastle, G. A.; Emley, N.; Shibauchi, T.; Krusin-Elbaum, L.; Guarini, K.; Black, C. T.; Tuominen, M. T.; Russell, T. P. *Science* 2000, 290, 2126; and Lopes, W. A.; Jaeger, H. M. *Nature* 2001, 414, 735. Several methods for incorporating inorganic nanoparticles into polymeric nanostructures have been described. In one, nanoparticles are generated within block copolymer micelles, where metal nanoparticles can be produced by simple chemical methods. See, for example, Cheng, G.; Moskovits, M. *Adv. Mater.* 2002, 14, 1567; Gorzolnik, B.; Mela, P.; Moeller, M. *Nanotechnology* 2006, 17, 5027; and Sohn, B.-H.; Choi, J.-M.; Yoo, S. I.; Yun, S.-H.; Zin, W.-C.; Jung, J. C.; Kanehara, M.; Hirata, T.; Teranishi, T. *J. Am. Soc. Chem.* 2003, 125, 6368. In another, the cooperative self-organization of nanoparticles and block copolymers is used with the need of subsequent chemistry. See, for example, Lopes, W. A.; Jaeger, H. M. *Nature* 2001, 414, 735; (13) Thompson, R. B.; Ginzburg, V. V.; Matsen, M. W.; Balazs, A. C. *Science* 2001, 292, 2469; Hamley, I. W. *Angew. Chem. Int. Ed.* 2003, 42, 1692; Chiu, J. J.; Kim, B. J.; Kramer, E. J.; Pine, D. J. *J. Am. Soc. Chem.* 2005, 127, 5036; Kim, B. J.; Chiu, J. J.; Yi, G.; Pine, D. J.; Kramer, E. *J. Adv. Mater.* 2005, 17, 2618; Lin, Y.; Böker, A.; He, J.; Sill, K.; Xiang, H.; Abetz, C.; Li, X.; Wang, J.; Emrick, T.; Long, S.; Wang, Q.; Balazs, A.; Russell, T. P. *Nature* 2005, 434, 55; Ansari, I. A.; Hamley, I. W. *J. Mater. Chem.* 2003, 13, 2412.

The surface reconstruction of BCPs, as reported previously, is another method to this end. See, for example, Xu, T.; Stevens, J.; Villa, J.; Goldbach, J. T.; Guarini, K. W.; Black, C. T.; Hawker, C. J.; Russell, T. P. *Adv. Funct. Mater.* 2003, 13, 698; Park, S.; Wang, J.-Y.; Kim, B.; Chen, W.; Russell, T. P. *Macromolecules* 2007, 40, 9059; and Park, S.; Kim, B.; Wang, J.-Y.; Russell, T. P. *Adv. Mater.* 2008, 20, 681. Surface reconstruction is a process where, in the case of a diblock copolymer with cylindrical microdomains oriented normal to the surface, upon exposure of the BCP film to a solvent that preferentially dissolves the minor component block, the minor component is drawn to the surface of the film, and, upon drying, cylindrical nanopores are produced with dimensions comparable to the original cylindrical microdomains. The minor component block fully coats the surface of the nanoporous film and, as shown by grazing incidence x-ray scattering, if the film thickness is a period of the BCP or less, the nanopores were found to span the film and had vertical side walls. Since the solvent does not alter the chemical structure of the BCP, the reconstruction is fully reversible. So, by heating the film to near its glass-transition temperature, $T_g$, a full recovery of the initial thin film morphology occurs. However, if the BCP film is heated to temperatures well in excess of $T_g$, then interfacial interactions will control the orientation of the microdomains. If, prior to heating, metal is evaporated at a glancing angle onto the surface of the reconstructed film, a porous metal film is obtained. In most pattern transfer approaches, a nanoporous polymer template has been used to transfer a pattern into underlying substrates using RIE and/or milling (see, for example, Park, M.; Chaikin, P. M.; Register, R. A.; Adamson, D. H. *Appl. Phys. Lett.* 2001, 79, 257; Cheng, J. Y.; Ross, C. A.; Thomas, E. L.; Smith, H. I.; Vancso, G. J. *Appl. Phys. Lett.* 2002, 81, 3657; Meli, M.-V.; Badia, A.; Grütter, P.; Lennox, R. B. *Nano. Lett.* 2002, 2, 131); Guarini, K. W.; Black, C. T.; Zhang, Y.; Kim, H.; Sikorski, E. M.; Babich, I. V. *J. Vac. Sci. Technol. B* 2002, 20, 2788; and Kubo, T.; Parker, J. S.; Hillmyer, M. A.; Leighton, C. *Appl. Phys. Lett.* 2007, 90, 233113), while the control of spatial location of metal on polymer template can be used as etching masks for preparation of various kinds of nanostructured patterns.

BRIEF DESCRIPTION OF THE INVENTION

Here we demonstrate the generation of various nanopatterned surfaces that can be obtained from the reconstructed BCP film coated with a thin layer of metal. Thin block copolymer films having cylindrical microdomains oriented normal to the surface were used. Reconstruction of the block copolymer films, followed by glancing angle metal evaporation onto the surface heating of the multilayer structure thus obtained led to various metal masks or templates that were suitable for pattern transfer into substrates using etching, or as templates for further metal evaporation to generate nanoscopic metal rings.

One embodiment is a method of preparing a nanopatterned surface, comprising: forming a block copolymer film on a substrate; wherein the block copolymer film has a thickness and comprises a major phase and a minor phase; and wherein the minor phase comprises cylindrical domains extending through the thickness of the block copolymer film; annealing the block copolymer film in an annealing solvent vapor to form an annealed block copolymer film; surface reconstructing the annealed block copolymer film to form a surface-reconstructed block copolymer film; wherein the surface-reconstructed block copolymer film comprises a major phase layer comprising the major phase and being in contact with a surface of the substrate, and a minor phase layer comprising the minor phase and being in contact with a surface of the major phase layer opposite the substrate; and wherein the surface-reconstructed block copolymer film defines an array of cylindrical pores; depositing a metal on the surface reconstructed block copolymer film to form a metal-coated block copolymer film comprising a metal layer contacting the minor phase layer on a surface of the minor phase layer opposite the major phase layer; and heating the metal-coated block copolymer film to form a redistributed metal-coated block copolymer film in which at least a portion of the metal has been transferred into the cylindrical pores.

Another embodiment is a nanopatterned article, comprising: a substrate; and a metal-decorated block copolymer film in contact with a surface of the substrate; wherein the metal-decorated block copolymer film has a thickness and comprises a continuous phase and a dispersed phase comprising cylindrical domains extending through the thickness of the film; wherein the continuous phase comprises a major phase of the block copolymer; wherein the dispersed phase comprises a minor phase of the block copolymer and nanodots comprising metal; and wherein the nanodots in the dispersed phase constitute at least 50 percent of the metal content of the article.

Another embodiment is a nanopatterned article, comprising: a substrate; a metal-decorated block copolymer film in contact with a surface of the substrate; and a metal layer in contact with a surface of the metal-decorated block copolymer film opposite the substrate; wherein the metal-decorated block copolymer film comprises a block copolymer and metal nanodots; and wherein the metal layer defines an array of essentially circular voids, each circular void disposed above a nanodot.

These and other embodiments are described in detail below.

BRIEF DESCRIPTION OF THE DRAWINGS

FIG. 2(a) shows gold nanoparticles on top of a solvent reconstructed film; FIG. 2(b) shows the product of heating a film like that of FIG. 2(a) at 115° C. for 10 minutes; FIG. 2(c) shows the product of heating a block copolymer film with a thicker gold layer at 180° C. for 30 minutes; insets in each image are magnified images.

DETAILED DESCRIPTION OF THE INVENTION

Figure 1:
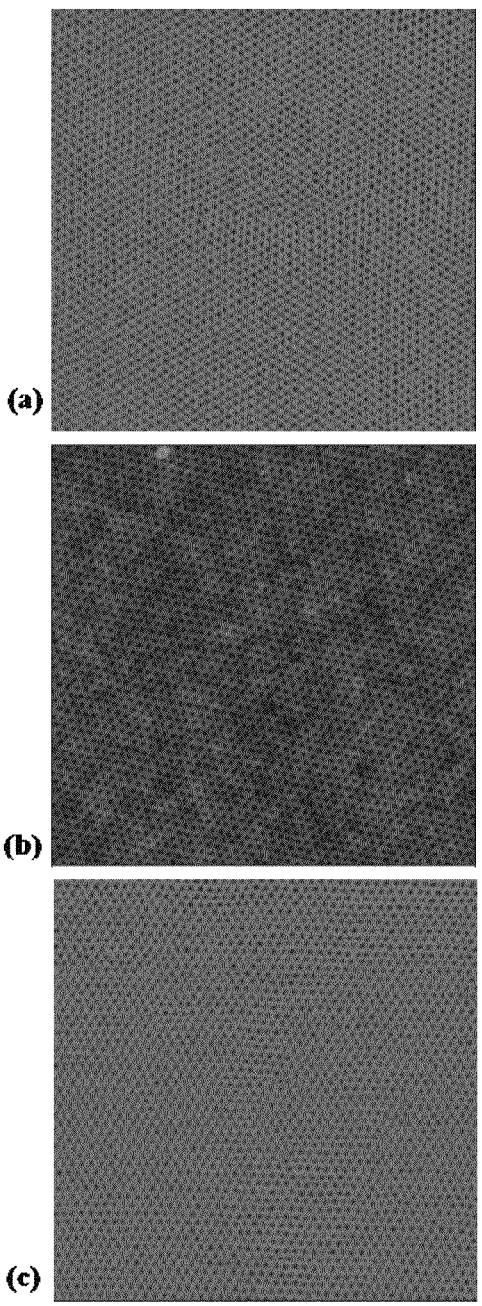
FIG. 1 consists of scanning force microscope (SFM) images of well-developed cylindrical micro domains and the corresponding structure after surface reconstruction; the three images show the block copolymer film (a) after solvent annealing, (b) after surface reconstruction, and (c) after thermal annealing.

One embodiment is a method of preparing a nanopatterned surface, comprising: forming a block copolymer film on a substrate; wherein the block copolymer film has a thickness and comprises a major phase and a minor phase; and wherein the minor phase comprises cylindrical domains extending through the thickness of the block copolymer film; annealing the block copolymer film in an annealing solvent vapor to form an annealed block copolymer film; surface reconstructing the annealed block copolymer film to form a surface-reconstructed block copolymer film; wherein the surface-reconstructed block copolymer film comprises a major phase layer comprising the major phase and being in contact with a surface of the substrate, and a minor phase layer comprising the minor phase and being in contact with a surface of the major phase layer opposite the substrate; and wherein the surface-reconstructed block copolymer film defines an array of cylindrical pores; depositing a metal on the surface reconstructed block copolymer film to form a metal-coated block copolymer film comprising a metal layer contacting the minor phase layer on a surface of the minor phase layer opposite the major phase layer; and heating the metal-coated block copolymer film to form a redistributed metal-coated block copolymer film in which at least a portion of the metal has been transferred into the cylindrical pores. As used herein, the term "nanopatterned" means comprising a pattern of features having dimensions of about 5 to about 500 nanometers, specifically about 10 to about 100 nanometers.

The first step of the method is forming a block copolymer film on a substrate. In general, the substrate may comprise any material that is wettable by the block copolymer and resistant to the solvents used for spin coating and solvent annealing of the block copolymer film. For embodiments in which reactive ion etching is used to etch the resist-coated block copolymer film, the substrate can comprise a material capable of being etched by reactive ion etching. Suitable materials include, for example, silicon, doped silicon, silicon dioxide, silicon nitride, passivated silicon, polystyrenes, polyimides, poly (butylenes terephthalate)s, and germanium. In some embodiments, the substrate surface in contact with the block copolymer film is chemically homogeneous. In some embodiments in which long-range order in the nanopatterned article is desirable, the substrate is a miscut, annealed crystalline substrate. The formation of block copolymer films on miscut, annealed crystalline substrates is described in Thomas P. Russell et al., U.S. Provisional Patent Application Ser. No. 61/098,253, filed Sep. 19, 2008.

The block copolymer can be formed using methods known in the art. In some embodiments, forming the block copolymer film comprises spin coating the block copolymer film from solution onto the substrate. For example, a solution comprising a polystyrene-poly(4-vinylpyridine) diblock copolymer in a mixture of toluene and tetrahydrofuran can be spin coated onto the substrate.

The block copolymer used for film forming comprises a major phase, corresponding to the continuous phase of the film, and a minor phase, corresponding to cylindrical domains extending through the thickness of the film. In order to form the two spatially distinct phases, the block copolymer should comprise at least two chemically distinct blocks. Thus, the block copolymer comprises a first block and second block that are sufficiently incompatible with each other to form separate phases. Incompatibility of the two blocks can be characterized by a difference in the Hildebrand solubility parameters of the two blocks. For example, when the block copolymer comprises a first block having a first Hildebrand solubility parameter and a second block having a second Hildebrand solubility parameter, the first Hildebrand solubility parameter and the second Hildebrand solubility parameter can differ by at least 0.4 megapascal$^{1/2}$.

In order to facilitate redistribution of a portion of the metal layer into the cylindrical voids formed on solvent reconstruction, it is preferable that at least one block of the block copolymer (i.e., the block corresponding to the minor phase of the block copolymer film) comprise functional groups capable of favorably interacting with the deposited metal. For example, at least one block of the copolymer can comprise basic nitrogen atoms, such as those in a pyridine group. Alternatively, at least one block of the copolymer can comprise basic oxygen atoms, such as the ether oxygen atoms in a poly(ethylene oxide) block.

In some embodiments, the block copolymer comprises a poly(vinyl-substituted nitrogen heterocycle) block that is the polymerization product of a vinyl-substituted nitrogen heterocycle selected from the group consisting of 2-vinylpyridine, 3-vinylpyridine, 4-vinylpyridine, 2-methyl-5-vinylpyridine 1-vinylimidazole, 2-vinylimidazole, 4-vinylimidazole, N-vinyl-2-methylimidazole, N-vinyl-2-ethylimidazole, 2-vinylpyrrole, 3-vinylpyrrole, and mixtures thereof. In some embodiments, the block copolymer comprises a poly(4-vinylpyridine) block or a poly(2-vinylpyridine) block.

In some embodiments, the block copolymer comprises a poly(alkylene oxide) block that is the polymerization product of a $C_2$-$C_6$ alkylene oxide. Examples include poly(ethylene oxide) and poly(propylene oxide).

The polymer block corresponding to the major phase of the block copolymer film can vary widely in chemical structure, as long as it is incompatible with the minor phase block. Suitable major phase blocks include, for example, polyolefins, poly(alkenyl aromatic)s, poly(conjugated dienes)s, hydrogenated poly(conjugated dienes)s, poly(vinyl-substituted nitrogen heterocycle)s, poly(alkyl (meth)acrylate)s, poly((meth)acrylic acid)s, poly(alkylene oxide)s, poly(arylene oxide)s, poly(arylene sulfide)s, poly(vinyl alkanoates), poly(vinyl ether)s, poly(vinyl halide)s, poly(vinyl alcohol)s, polyurethanes, poly(meth)acrylonitriles, polyesters, polyamides, polyimides, polycarbonates, polysulfones, and polysiloxanes.

In some embodiments, the block copolymer corresponding to the major phase of the block copolymer film is a poly (alkenyl aromatic) block that is the polymerization product of an alkenyl aromatic monomer having the structure

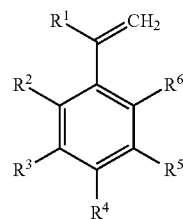

wherein $R^1$ is hydrogen or $C_1$-$C_6$ alkyl, and each occurrence of $R^2$, $R^3$, $R^4$, $R^5$, and $R^6$ is independently selected from the group consisting of hydrogen, $C_1$-$C_6$ alkyl, and halogen. In some embodiments, the block copolymer corresponding to the major phase of the block copolymer film is a polystyrene block.

In order to form a film comprising cylindrical domains, the block copolymer typically comprises blocks differing in number average molecular weight by at least a factor of 1.5. In some embodiments, the number average molecular weights of the blocks differ by a factor of 1.5 to 6, more specifically a factor of 2 to 5, still more specifically a factor of 3 to 4.

In a very specific embodiment, the block copolymer is a polystyrene-poly(4-vinylpyridine) or polystyrene-poly(2-vinylpyridine) diblock copolymer. In another very specific embodiment, the block copolymer is a polystyrene-poly(ethylene oxide) diblock copolymer.

The block copolymer film typically has a thickness of about 10 to about 100 nanometers. In some embodiments, the block copolymer film has a thickness corresponding to about one period of the block copolymer. The relationship between film thickness and the period of the block copolymer can be determined using methods known in the art. See, for example, T. P. Russell, P. Lambooy, J. G. Barker, P. D. Gallagher, S. K. Satija, G. J. Kellogg, and A. M. Mayes, *Macromolecules* 1995, 28, 787; and A. M. Mayes, S. K. Kumar, *MRS Bulletin*, 1997, 22, 43.

Once the block copolymer film is formed, it is annealed. In some embodiments, the block copolymer film is thermally annealed. For example, when the block copolymer is a polystyrene-block-poly(n-butyl methacrylate) diblock copolymer, the block copolymer can be annealed at 170° C. for four days. In other embodiments, the block copolymer film is annealed by exposure to solvent vapors. For example, in embodiments, when the block copolymer is a polystyrene-poly(4-vinylpyridine) diblock copolymer, the annealing solvent vapor can comprise toluene and tetrahydrofuran.

The block copolymer film comprises cylindrical domains extending through the thickness of the block copolymer film. In some embodiments, the annealed block copolymer film comprises a hexagonal array of cylindrical microdomains. Such hexagonal arrays can exhibit an orientation order of at least 0.9 over an area of at least 1 centimeter$^2$. Ordered arrays in areas of 2.25 centimeter$^2$ (1.5 centimeter×1.5 centimeter) are demonstrated in the working examples below. Areas of at least 25 centimeter$^2$ (5 centimeter×5 centimeter) are feasible with the techniques described herein. In contrast, lithographic techniques typically generate ordered arrays over areas on the order of 250 micrometer (50 micrometers×50 micrometers). Orientation order can be determined by image analysis of scanning force microscopy images of the block copolymer films using, for example, MATLAB software from. The Mathworks. The cylindrical microdomains can be separated by a nearest-neighbor distance of about 10 to about 100 nanometers.

After the block copolymer film is annealed, it is surface reconstructed. The surface reconstruction method is described in T. Xu, C. J. Hawker, and T. P. Russell, *Advanced Functional Materials* 2003, 13, 698, and T. P. Russell et al. U.S. patent application Ser. No. 12/049,541, filed Mar. 17, 2008. The surface reconstruction method typically consists of exposing the annealed block copolymer film to a solvent that preferentially dissolves the minor phase of the block copolymer film and effects transfer of that phase to the surface of the film opposite the substrate. It is important to note that no chemical bonds are broken in the surface reconstruction process, and that the process is reversible (for example, by the application of heat). Surface reconstruction is conducted at a temperature below the glass transition temperature of the major (matrix) phase of the block copolymer film, so that the structure of the film is conserved in that the spaces formerly occupied by the minor phase are converted to voids. Thus, when the minor phase consists of cylinders perpendicular to the plane of the film, surface reconstruction results in migration of the minor phase to the top surface of the film and formation of cylindrical voids where the minor phase formerly resided. The cylindrical voids extend from the substrate surface through the major phase-containing layer and the minor phase-containing layer to the top of the block copolymer film. In some embodiments, the block copolymer is a polystyrene-poly(4-vinylpyridine) diblock copolymer, and surface reconstructing the annealed block copolymer film comprises immersing the block copolymer film in a lower alkanol solvent such as methanol, ethanol, 1-propanol, 2-propanol, or a mixture thereof.

After the block copolymer film is surface reconstructed, metal is deposited on the surface-reconstructed film. For simplicity, the term "metal layer" is used herein to describe the form of the deposited metal. However, particularly at low deposition levels, the deposited metal need not form a continuous metal layer. It can instead consist of metal nanoparticles that do not form a continuous layer.

The thickness of the metal layer will depend on the ultimate structure desired. In order to form a template in which the metal exists as metal nanodots within the cylindrical domains, the metal layer typically has a thickness of about 0.15 to about 0.5 nanometers, specifically 0.2 to about 0.4 nanometers. These are nominal thickness values, calculated by weighing the metal deposit over a known area of the block copolymer film and assuming a uniformly thick metal layer. As demonstrated in the working examples below, particularly at low nominal thicknesses, the actual metal deposit can be discontinuous, with some areas of the film not covered in metal and other areas of the film covered with metal nanoparticles of dimensions greater than the nominal metal layer thickness.

In order to form a template in which the metal defines nanoring-shaped voids, the metal layer typically has a thickness of about 0.5 to about 5 nanometers, specifically 1 to 4 nanometers, more specifically 2 to 3 nanometers.

There is no particular limitation on the type of metal to be deposited. Suitable metals include, for example, those of Groups 3-12 of the periodic table and alloys thereof, and specifically gold, silver, and chromium. In order to preserve the cylindrical voids in the solvent-reconstructed film, metal is typically deposited from a glancing angle relative to the plane of the block copolymer film.

After metal is deposited on the surface-reconstructed block copolymer film, the resulting metal-coated block copolymer film is heated to form a redistributed metal-coated block copolymer film in which at least a portion of the metal has been transferred into the cylindrical pores. In some embodiments, the metal-coated block copolymer film is heated to a temperature within about 40° C. of the glass transition temperature of the minor phase block. For example, to form a template in which the metal exists as metal nanodots within the cylindrical domains, a metal-coated block copolymer film comprising a metal layer with a thickness of about 0.15 to about 0.5 nanometers can be heated at about 105 to about 125° C., specifically about 110 to about 120° C., for about 5 to about 20 minutes, specifically about 5 to about 15 minutes. This step results in migration of both the block copolymer minor phase and the metal (i.e., substantially all of the metal) into the cylindrical void. The resulting template thus comprises a block copolymer film with gold-containing cylindrical domains. Experiments described below show that the metal nanodots are in contact with the substrate.

To form a template in which the metal exists defines nanoring-shaped voids, a metal-coated block copolymer film comprising a metal layer with a thickness of about 0.5 to about 5 nanometers is heated at about 170 to about 190° C., specifically about 175 to about 185° C., for about 20 to about 40 minutes, specifically 25 to 35 minutes. This heating step redistributes a small portion of the metal layer from ring-shaped areas surrounding the cylindrical pores into the center of the cylindrical pores, thus creating nanoring-shaped voids in metal coverage of the substrate, when viewed from above the metal coated film. The portion of metal transferred to the cylindrical domains is typically small that the portion that would be transferred from a thinner metal layer in the nanodot method described above. The resulting template with nanoring-shaped voids can be further processed to form metal nanorings. Specifically, the template with nanoring-shaped voids can be further processed by etching the redistributed metal-coated block copolymer film (to remove polymer surrounding the metal nanoparticles in the cylindrical microdomains), depositing a second metal onto the etched, redistributed metal-coated block copolymer film, thereby forming nanorings comprising the second metal and contacting the substrate, and separating the substrate and nanorings from the etched, redistributed metal-coated block copolymer film. The etching step can each be conducted with reactive ion etching methods known in the art. For example, the etching step can comprise reactive ion etching with $CHF_3$, $SF_6$, or $CF_4$, or a combination of the foregoing compounds. The second metal can be a metal from Groups 3-12 of the periodic table and alloys thereof, and specifically gold, silver, and chromium, more specifically chromium. The second metal can be the same as or different from the first metal (i.e., the metal deposited onto the surface-reconstructed block copolymer film) In some embodiments, the first metal is gold and the second metal is chromium. Methods described above for forming the metal layer can also be used to deposit the second metal. Separation of the nanoring-decorated substrate from the etched, redistributed metal-coated block copolymer film can be accomplished with methods known in the art for separating block copolymer films from substrates. A suitable method demonstrated in the working examples below utilizes sonication to effect the separation. Various "lift-off" techniques can also be employed.

The metal nanodot- and nanoring-containing templates can be further processed to transfer the metal nanopattern to the substrate. For example, the nanodot-containing template can be used to generate a substrate comprising nanopillars using a method in which the metal layer has a thickness of about 0.15 to about 0.5 nanometers, the metal coated block copolymer film is heated at about 105 to about 125° C. for about 5 to about 20 minutes (thereby redistributing the metal layer into the cylindrical pores to form nanodots in contact with the substrate), and the method further comprises etching through the redistributed metal-coated block copolymer film and into the substrate (wherein the metal nanodots serve as an etch resist protecting the tops of the incipient pillars). After this process, the only remaining metal is the metal nanodots on the top of the substrate pillars. If desired, these metal nanodots can be removed by a technique to selectively dissolve the metal (e.g., use of a potassium iodide/iodine solution). Particularly if the metal nanodots are not removed, the structure can, optionally, be further etched to remove any residual block copolymer. The first (required) etching step can comprise reactive ion etching with $SF_6$. The second (optional) etching step can comprise oxygen plasma etching. This method is demonstrated in the working examples below.

As another example, the template comprising nanoring-shaped voids can be used to generate a substrate comprising nanoring-shaped voids using a method in which the metal layer has a thickness of about 0.5 to about 5 nanometers, the metal coated block copolymer film is heated at about 170 to about 190° C. for about 20 to about 40 minutes thereby redistributing a portion of the metal layer from a ring surrounding the cylindrical pores into the cylindrical pores (thus creating nanoring-shaped voids in metal coverage of the substrate, when viewed from above the metal coated film), and the method further comprises etching through the redistributed metal-coated block copolymer film and into the substrate, and separating the etched, redistributed metal-coated block copolymer film from the etched substrate (but leaving metal caps on the pillars inside the ring-shaped voids), thereby forming an etched substrate comprising a surface defining nanoring-shaped voids. The structure can, optionally, be further etched to remove any residual block copolymer. The first (required) etching, separating, and second (optional) etching steps can be conducted as described in the previous paragraph. This method is demonstrated in the working examples below.

The metal nanodot- and nanoring-containing templates can also be used to form structures in which a conducting or semiconducting layer is formed on top of a substrate with a metal nanodot or nanoring array.

In a very specific embodiment of the method suitable for forming a metal nanodot-decorated article, the block copolymer film comprises a polystyrene-block-poly(4-vinylpyridine) diblock copolymer comprising a polystyrene block having a number average molecular weight of about 6,000 to about 30,000 atomic mass units and a poly(4-vinylpyridine) or poly(2-vinylpyridine) block having a number average molecular weight of about 2,000 to about 10,000 atomic mass units, wherein the ratio of the number average molecular weight of the polystyrene block to the number average molecular weight of the poly(4-vinylpyridine) or poly(2-vinylpyridine) block is about 2 to about 6; the annealing the block copolymer film comprises exposing the block copolymer film to an annealing solvent vapor comprising toluene and tetrahydrofuran; the surface reconstructing the annealed block copolymer film comprises immersing the annealed block copolymer film in a solvent comprising a $C_1$-$C_3$ alkanol; the metal comprises gold; the metal layer has a thickness of about 0.15 to about 0.5 nanometers; and the heating the metal coated block copolymer film comprises heating at about 105 to about 125° C. for about 5 to about 20 minutes, thereby redistributing the minor phase and the metal layer into the cylindrical pores to form nanodots in contact with the substrate.

In a very specific embodiment of the method suitable for forming an article comprising nanoring-shaped voids, the block copolymer film comprises a polystyrene-block-poly(4-vinylpyridine) diblock copolymer comprising a polystyrene block having a number average molecular weight of about 6,000 to about 30,000 atomic mass units and a poly(4-vinylpyridine) or poly(2-vinylpyridine) block having a number average molecular weight of about 2,000 to about 10,000 atomic mass units, wherein the ratio of the number average molecular weight of the polystyrene block to the number average molecular weight of the poly(4-vinylpyridine) or poly(2-vinylpyridine) block is about 2 to about 6; the annealing the block copolymer film comprises exposing the block copolymer film to an annealing solvent vapor comprising toluene and tetrahydrofuran; the surface reconstructing the annealed block copolymer film comprises immersing the annealed block copolymer film in a solvent comprising a $C_1$-$C_3$ alkanol; the metal comprises gold; the metal layer has a thickness of about 0.5 to about 5 nanometers; and the heating the metal coated block copolymer film comprises heating at about 170 to about 190° C. for about 20 to about 40 minutes, thereby redistributing a portion of the metal layer from ring-shaped areas surrounding the cylindrical pores into the cylindrical pores (thus creating nanoring-shaped voids in metal coverage of the substrate, when viewed from above the metal coated film) In order to form a substrate comprising chromium nanorings, the above method can further comprise etching the redistributed metal-coated block copolymer film (to remove polymer surrounding the gold nanoparticles in the cylindrical microdomains), depositing a second metal comprising chromium onto the etched, redistributed metal-coated block copolymer film, thereby forming nanorings comprising the second metal and contacting the substrate, and separating the substrate and nanorings from the etched, redistributed metal-coated block copolymer film. The separating step can be conducted by sonication or lift-off techniques capable of separating the block copolymer film from the substrate.

The invention extends to certain articles prepared by the method and believed to be novel independent of their method of preparation. Thus, one embodiment is a nanopatterned article, comprising: a substrate; and a metal-decorated block copolymer film in contact with a surface of the substrate; wherein the metal-decorated block copolymer film has a thickness and comprises a continuous phase and a dispersed phase comprising cylindrical domains extending through the thickness of the film; wherein the continuous phase comprises a major phase of the block copolymer; wherein the dispersed phase comprises a minor phase of the block copolymer and nanodots comprising metal; and wherein the nanodots in the dispersed phase constitute at least 50 weight percent of the metal content of the article. In some embodiments, the nanodots in the dispersed phase constitute at least 60 percent of the metal content of the article, specifically at least 70 percent of the metal content of the article, more specifically at least 80 percent of the metal content of the article, still more specifically at least 90 weight percent of the metal content of the article.

Another embodiment is a nanopatterned article, comprising: a substrate; a metal-decorated block copolymer film in contact with a surface of the substrate; and a metal layer in contact with a surface of the metal-decorated block copolymer film opposite the substrate; wherein the metal-decorated block copolymer film comprises a block copolymer and metal nanodots; and wherein the metal layer defines an array of essentially circular voids, each circular void disposed above a nanodot. Put differently, where a hypothetical cylinder has a major axis perpendicular to the metal layer and a radius in contact with a circular void, and the hypothetical cylinder extends through a circular void and down to the substrate, the hypothetical cylinder would encompass a nanodot. In other words, when viewed from above (i.e., from the metal layer side of the article), a nanodot can be seen in the center of each circular void. An example of such a structure is shown in FIG. 2(c).

Another embodiment is a nanopatterned article, comprising: a substrate; and an array of metal nanorings contacting a surface of the substrate; wherein the surface of the substrate has an area of at least 1 centimeter$^2$; and wherein the metal nanorings have an outer diameter of about 10 to about 50 nanometers. The metal nanoring outer diameter can be 15 to 40 nanometers, specifically 20 to 35 nanometers. The size of the metal nanoring outer diameter can be controlled by varying the molecular weight of the polymer block that forms the cylindrical domains. The method of fabricating such a nanopatterned article is described above, and a specific embodiment of the nanopatterned article is fabricated in the working examples below.

Another embodiment is a nanopatterned article, comprising: a substrate comprising a surface defining an array of ring-shaped voids; wherein the surface has an area of at least 1 centimeter$^2$; and wherein the ring-shaped voids have an outer diameter of about 10 to about 50 nanometers. The ring-shaped void outer diameter can be 15 to 40 nanometers, specifically 20 to 35 nanometers. The size of the outer diameter of the ring-shaped voids can be controlled by varying the molecular weight of the polymer block that forms the cylindrical domains. The method of fabricating such a nanopatterned article is described above, and a specific embodiment of the nanopatterned article is fabricated in the working examples below.

The invention is further illustrated by the following non-limiting examples.

EXAMPLES

Block copolymer films were prepared by spin-coating 0.5 weight percent polystyrene-block-poly(4-vinylpyridine) (PS-b-P4VP) copolymer toluene/tetrahydrofuran (THF) solutions onto silicon wafers. The copolymer used in the experiments was a PS-b-P4VP diblock (obtained from Polymer Source) with a molecular weight of 68.7 kg/mol ($M_n^{PS}$=47.6 kg/mol; $M_n^{P4VP}$=20.9 kg/mol) and polydispersity of 1.14. To make highly oriented cylindrical P4VP microdomains in a PS matrix, the films were vapor annealed in a saturated toluene/THF (20/80, volume/volume) environment for 6 hours. Surface reconstruction was achieved by immersing the films in ethanol for 20 minutes, where ethanol is a good solvent for P4VP but a non-solvent for PS. To prepare transmission electron microscopy (TEM) samples, the gold-decorated PS-b-P4VP films were floated off from the silicon substrate in 0.5 wt % HF solution and collected on carbon-coated grids. Bright-field TEM was performed on a (JEOL-1200EX) TEM operating at an accelerating voltage of 100 kV.

Figure 6:
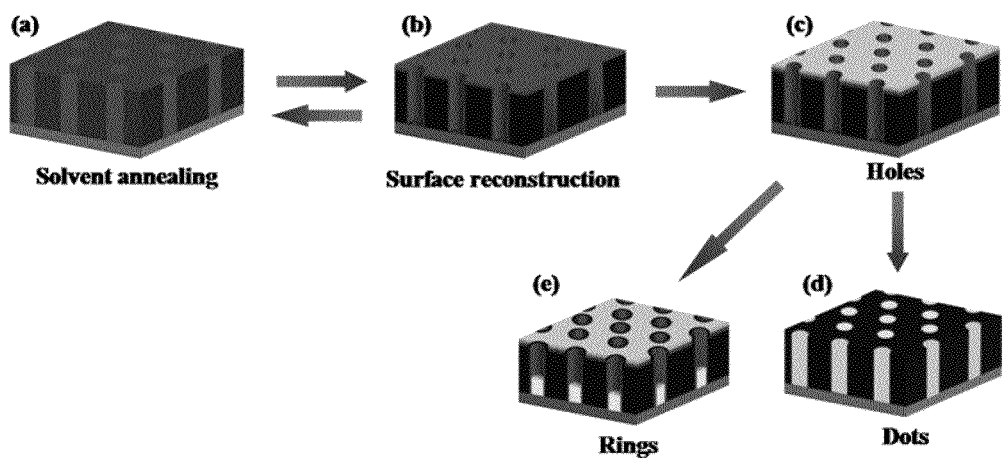
FIG. 6 illustrates the process of gold decorated films prepared from nanoporous BCP templates.

FIG. 6 illustrates the process of gold decorated films prepared from nanoporous BCP templates. Highly oriented cylindrical microdomains were developed after solvent annealing in toluene/THF mixed solvent (structure (a)). Nanoporous films were produced by swelling the cylindrical microdomains of the copolymer with a preferential solvent, such as ethanol (structure (b)). Since neither block of the copolymer was fundamentally altered by the solvent, the process was fully reversible. By heating the film to near its glass-transition temperature, full recovery of the initial film morphology was achieved. Nanoporous gold film was produced by gold sputtering at a glancing angle (about 3-5°) to the substrate without entering into the pores (structure (c)). By varying the thickness of the gold layer and thermal annealing condition, gold dots (d) and rings (e) were obtained.

FIG. 1 shows scanning force microscope (SFM) images of well-developed cylindrical microdomains and the corresponding structure after surface reconstruction. Cylindrical microdomains oriented normal to the substrate, having hexagonal order immediately after spin coating have been shown previously. Park, S.; Wang, J.-Y.; Kim, B.; Chen, W.; Russell, T. P. *Macromolecules* 2007, 40, 9059. Highly oriented arrays of cylindrical microdomains with about 2 nanometer depressions were obtained by solvent annealing and are shown in FIG. 1(*a*). A reconstructed film having arrays of highly ordered nanopores is shown in FIG. 1(*b*). The preferential solvation of P4VP blocks with ethanol is shown to produce a nanoporous template while preserving the order or orientation of the microdomains. FIG. 1(*c*) shows an SFM image of the film after annealing the reconstructed film at 115° C. for 10 minutes. It should be noted that the SFM images show that the original structure is retained without any significant change except for changing the film thickness throughout the entire process, where a hexagonal array of cylindrical micro domains or nanopores with an average nearest-neighbor distance of 45.3±2.3 nanometers and pore diameter of 25.0±1.7 nanometers. The surface roughness after reconstruction was <0.5 nanometer.

The reconstructed films are kinetically trapped in an energetically unstable state, due to the large surface area produced by the formation of the nanopores and since the surface energy of P4VP is greater than that of PS ($\gamma_{P4VP}$=50.0 mJ/m$^2$, and $\gamma_{PS}$=45.5 mJ/m$^2$). Sohn, B.-H.; Seo, B.-W.; Yoo, S. I.; Zin, W.-C. *Langmuir* 2002, 18, 10505. Consequently, a recovery to the original morphology would be expected initially by heating the films above the $T_g$. The thickness of the original and reconstructed films, as measured by optical ellipsometry and x-ray reflectivity, were 24.1 nanometers and 27.1 nanometers, respectively. Upon heating the reconstructed film to 115° C. for 10 minutes, the thickness decreased to 24.1 nanometers, and the original morphology was recovered. It should be noted that continued heating of the film results in a reorientation of the microdomains parallel to the film surface, due to preferential interfacial interactions of P4VP with the substrate and the lower surface energy of the PS block. The movement of P4VP to affect the recovery of the reconstructed films was used to control the spatial placement of material placed on the surface of the reconstructed films Gold was thermally evaporated (at a rate of 0.01 nanometer/second) onto the reconstructed film at a glancing angle under a pressure of 5×10$^{-6}$ Torr, to a nominal thickness of 1 nanometer, as measured by a quartz crystal microbalance. During evaporation, atomic gold diffuses on the surface of the reconstructed film and coalesces, forming nanoparticles. Gold preferentially interacts with the P4VP block, and a thin layer (about 2 nanometers on average) of densely packed gold nanoparticles forms on the surface.

Figure 2:
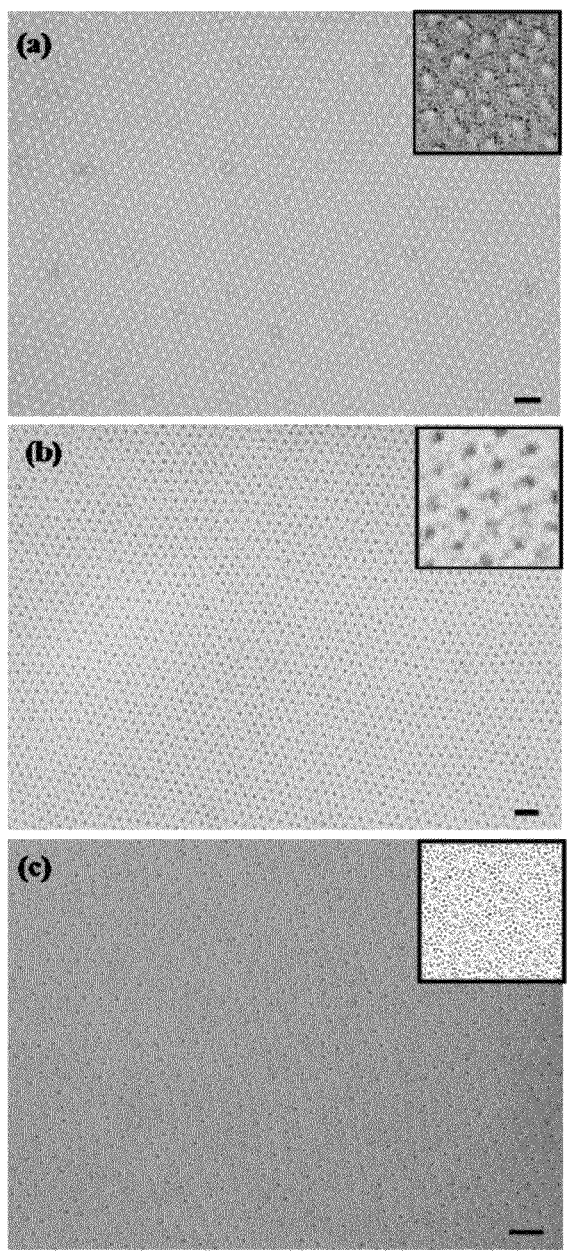
FIG. 2 shows TEM images of three different reconstructed PS-b-P4VP films decorated with gold in different ways, depending on the experimental conditions.

FIG. 2 shows TEM images of three different reconstructed PS-b-P4VP films decorated with gold in different ways, depending on the experimental conditions. The scale bars in the FIG. 2 images are 100 nanometers. FIG. 2(*a*) shows gold nanoparticles located on top of a reconstructed film, where gold sputtering was carried out at a glancing angle (about 5°) to the substrate so that gold nanoparticles selectively decorated the film surface only, without entering into the pores. Consequently, a nanoporous gold film is produced that is suitable as a mask for pattern transfer. By heating a gold-decorated reconstructed film having a nominal gold layer thickness of less than or equal to 0.5 nanometers (thicknesses of about 0.2 to about 0.5 nanometers have been used) to 115° C. for 10 minutes, the gold nanoparticles are drawn into the pores along with the P4VP, as shown in FIG. 2(*b*). If the gold layer is thicker than 0.5 nanometer, this does not occur. It should be noted that even after the gold goes into the pore, the size of cylindrical microdomains does not change in comparison to that of the reconstructed film. When the annealing temperature is increased to 180° C. for 30 minutes, the gold-coated reconstructed films undergo a different recovery. If the thickness of the evaporated gold is >0.5 nanometer, some of the gold is drawn into the pores forming nanoparticles in the center of the microdomains, leaving the remainder of gold on the surface. Viewed from above, a ring pattern forms, as shown in FIG. 2(*c*), which was generated using a gold film with an initial nominal thickness of greater than 0.5 nanometers (thicknesses of about 0.6 to about 1 nanometer have been used). This pattern is suitable for transfer to the underlying substrate. In addition, this process offers a simple but direct means of placing nanoparticles at a precise location between two conducting or semi-conducting layers.

Figure 3:
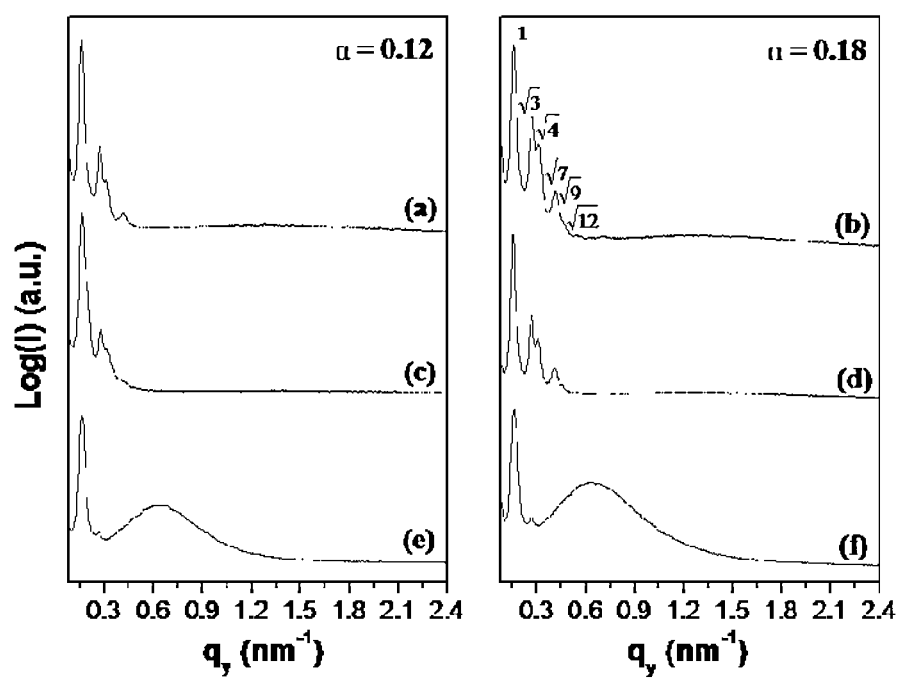
FIG. 3 consists of grazing incidence-small angle x-ray scattering (GISAXS) traces taken along the horizon, that is, along $q_y$ ($q_z=0$), for gold-coated, solvent-reconstructed block copolymer films; (a, b) top of the reconstructed films, (c,d) inside the poly(4-vinylpyridine) cylindrical domains, and (e,f) top of films and inside poly(4-vinylpyridine) cylindrical domains; for images (a)-(c), $\alpha=0.12$ (below the critical angle of the polymer), and for images (d)-(f), $\alpha=0.18$ (above the critical angle of the polymer).

The location of gold nanoparticles on the PS-b-P4VP film was also investigated by grazing incidence-small angle x-ray scattering (GISAXS). GISAXS measurements were performed at beamline X22B (National Synchrotron Light Source, Brookhaven National Laboratory) using x-rays with a wavelength of $\lambda=1.525$ Å. The GISAXS patterns were measured below ($\alpha=0.12°$) and above ($\alpha=0.18°$) the critical angle of the polymer ($\alpha_c=0.16°$). The former provides structural information at the surface, while the latter provides structural information throughout the film A cursory examination of the GISAXS patterns is that the interferences characteristics of the hexagonal array of the microdomains are extended in the $q_z$ direction, that is, normal to the film surface. Further assessment of the scattering requires a closer examination of the profiles. Shown in FIG. 3(a)-(f) are traces taken along the horizon, that is, along $q_y$ ($q_z=0$). For the reconstructed film with gold evaporated on the surface, the GISAXS profiles above and below the critical angle are identical in shape, though the intensities differ. For $\alpha<\alpha_c$, scattering characteristic of a hexagonal array of holes in the gold film is seen. For $\alpha>\alpha_c$, a significant increase in the scattering is seen due to an increase in the contrast, that is, the electron density difference between the air in the pores and the matrix. Hence, an increase in the intensity and a sharpening of the interference maxima in the GISAXS, for $\alpha>\alpha_c$, are seen in FIGS. 3(a) and 3(b). The GISAXS results indicate that gold is uniformly distributed in the cylindrical microdomains as one proceeds from the top of the film to the bottom, as shown in FIGS. 3(c) and (d). The gold has been drawn into the cylindrical microdomains but there does not appear to be any significant aggregation of the gold in the pores. When the thickness of the gold is >0.5 nanometer, the scattering arising from the gold layer is seen for $\alpha<\alpha_c$ and $\alpha>\alpha_c$ (FIGS. 3(e) & (f)). However, a pronounced maximum arising from the form factor of gold nanoparticles within the pore is seen. This scattering is not seen in the other cases, indicating that the formation of gold nanoparticles does not occur. It should be noted that scattering from the nanodots is characteristic of a single layer at the substrate interface.

Figure 4:
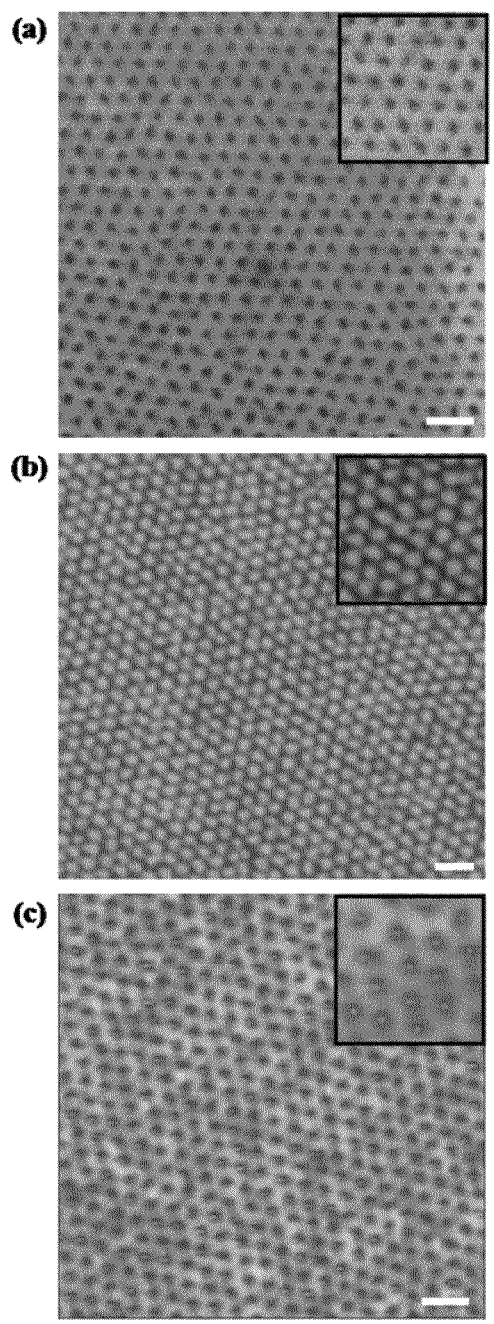
FIG. 4 shows pattern transfer of three gold-decorated polymer templates into silicon oxide using $SF_6$ reactive ion etching; in the inset, pattern transfer results are magnified for clarity.

To transfer the pattern produced by the gold coated polymer films into the underlying substrate, the films were exposed to a $SF_6$ reactive ion etching (RIE; TRION technology, at 50 millitorr pressure, 25 standard cubic centimeters per minute (SCCM) flow rate, and 40 watts power). After etching into the silicon oxide, the gold coated films were removed with a 10 weight percent potassium iodide/iodine solution ($KI/I_2$ solution; 4/1 volume/volume), followed by oxygen plasma etching for 10 minutes. FIG. 4 shows pattern transfer of three gold decorated polymer templates into silicon oxide using $SF_6$ RIE, which are identical to those seen in the original templates. The scale bars in the FIG. 4 images are 100 nanometers. In the inset, pattern transfer results are magnified for clarity. It should be noted that the metal coated films can be used as hard etching masks for pattern transfer into the underlying substrate.

Figure 5:
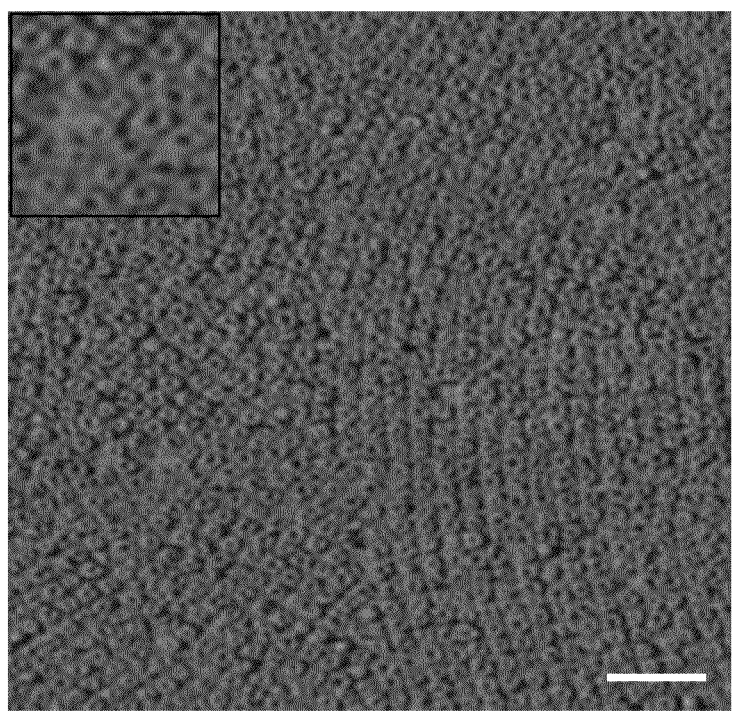
FIG. 5 shows the SEM image of a chromium nanoring pattern obtained by coating chromium onto gold-decorated films having nanoring-shaped voids; in the magnified inset in the top-left corner of FIG. 5, a chromium nanoring pattern with a long-range order is clearly seen.

In addition to pattern transfer from gold decorated films, a metal nanoring pattern could also be produced. FIG. 5 shows the SEM image of a chromium nanoring pattern obtained from the gold-decorated films having nanoring-shaped voids, each nanoring-shaped void defined by a circular void in the gold layer and a gold nanodot on the substrate surface directly under the circular void. The scale bar in the FIG. 5 image is 200 nanometers. The gold-decorated nanoring pattern were reactively ion etched (TRION technology, at 50 millitorr pressure, 30 SCCM flow rate, and 50 W power) with trifluoromethane ($CHF_3$) to remove polymer surrounding the gold nanoparticles in the cylindrical microdomains. Then, chromium was thermally evaporated onto the etched template to a nominal thickness of about 8 nanometers, as measured by a quartz crystal microbalance. The films were then sonicated in chloroform for 5 minutes to remove the excess chromium. In the magnified inset in the top-left corner of FIG. 5, the chromium nanoring pattern with a long-range order is clearly seen.

Additional experimental details are provided in S. Park, J.-Y. Wang, B. Kim, and T. P. Russell, "From Nanorings to Nanodots by Patterning with Block Copolymers", *Nano Letters* 2008, 8, 1667, as well as the Supporting Information accompanying that article.

In summary, we have demonstrated methods for the generation of metal-decorated block copolymer films with nanodot and nanoring patterns. Films of block copolymers having arrays of highly ordered cylindrical microdomains were prepared by solvent annealing. Using a preferential solvent for the minor phase, a reversible reconstruction of the films occurred, producing a nanoporous template. By varying the amount of metal evaporated onto the surface, nanoporous metal films could be produced and annealed to draw the metal into the cylindrical microdomains (forming metal nanodots), or a nanoporous metal film with metal nanodots at the base of the pores could be produced (thereby defining a nanoring-shaped void in the metal coverage of the substrate). The metal-coated polymer templates could be transferred into the substrate with high fidelity using reactive ion etching. And a substrate decorated with metal nanorings could be obtained from further processing of the structure comprising a nanoporous metal film with metal nanodots at the base of the pores.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A nanopatterned article, comprising:
a substrate; and
a metal-decorated block copolymer film in contact with a surface of the substrate;
wherein the metal-decorated block copolymer film has a thickness and comprises a continuous phase and a dispersed phase comprising a hexagonal array of cylindrical domains extending through the thickness of the film;
wherein the hexagonal array has an orientation order of at least 0.9 over an area of at least 1 centimeter$^2$;
wherein the continuous phase comprises a major phase of the block copolymer;
wherein the dispersed phase comprises a minor phase of the block copolymer and nanodots comprising metal; and
wherein the nanodots in the dispersed phase constitute at least 50 weight percent of the metal content of the article.

2. A nanopatterned article, comprising:
a substrate;
a metal-decorated block copolymer film in contact with a surface of the substrate; and
a metal layer in contact with a surface of the metal-decorated block copolymer film opposite the substrate;
wherein the metal-decorated block copolymer film comprises a block copolymer and metal nanodots;
wherein the metal layer defines an array of essentially circular voids, each circular void disposed above a nanodot; and
wherein each circular void is separated by a nearest-neighbor distance of 10 to 100 nanometers.

* * * * *